US009240246B2

(12) United States Patent
Han

(10) Patent No.: US 9,240,246 B2
(45) Date of Patent: Jan. 19, 2016

(54) SEMICONDUCTOR DEVICE HAVING FUSE CIRCUIT

(71) Applicant: SK hynix Inc., Gyeonggi-do (KR)

(72) Inventor: Min-Sik Han, Gyeonggi-do (KR)

(73) Assignee: SK Hynix Inc., Gyeonggi-do (KR)

( * ) Notice: Subject to any disclaimer, the term of this patent is extended or adjusted under 35 U.S.C. 154(b) by 7 days.

(21) Appl. No.: 14/292,351

(22) Filed: May 30, 2014

(65) Prior Publication Data

US 2015/0155051 A1    Jun. 4, 2015

(30) Foreign Application Priority Data

Dec. 2, 2013    (KR) .................. 10-2013-0148516

(51) Int. Cl.
*G11C 7/00*    (2006.01)
*G11C 17/18*    (2006.01)
*G11C 5/14*    (2006.01)
*G11C 8/00*    (2006.01)

(52) U.S. Cl.
CPC ..................... *G11C 17/18* (2013.01)

(58) Field of Classification Search
USPC .................. 365/200, 203, 225.7, 226, 240
See application file for complete search history.

(56) References Cited

U.S. PATENT DOCUMENTS

| 6,556,479 B2 * | 4/2003 | Makuta et al. ................ 365/200 |
| 7,990,787 B2 * | 8/2011 | Tooher .......................... 365/200 |
| 8,477,521 B2 * | 7/2013 | Kim et al. ..................... 365/200 |
| 8,982,655 B1 * | 3/2015 | Henry et al. ............... 365/225.7 |

FOREIGN PATENT DOCUMENTS

| KR | 1020080035208 | 4/2008 |
| KR | 1020080084125 | 9/2008 |

* cited by examiner

*Primary Examiner* — Trong Phan
(74) *Attorney, Agent, or Firm* — IP & T Group LLP

(57) ABSTRACT

A semiconductor device includes a fuse array with a plurality of fuses, a common signal generation unit suitable for receiving a power-up signal and generating an inverted power-up signal and a reset signal, a plurality of fuse registers suitable for latching a plurality of fuse data for the plurality of fuses and commonly receiving the inverted power-up signal and the reset signal from the common signal generation unit by grouped fuse registers, and an output selection unit suitable for outputting the plurality of fuse data stored on the plurality of fuse registers according to a predetermined sequence.

15 Claims, 11 Drawing Sheets

FIG. 6
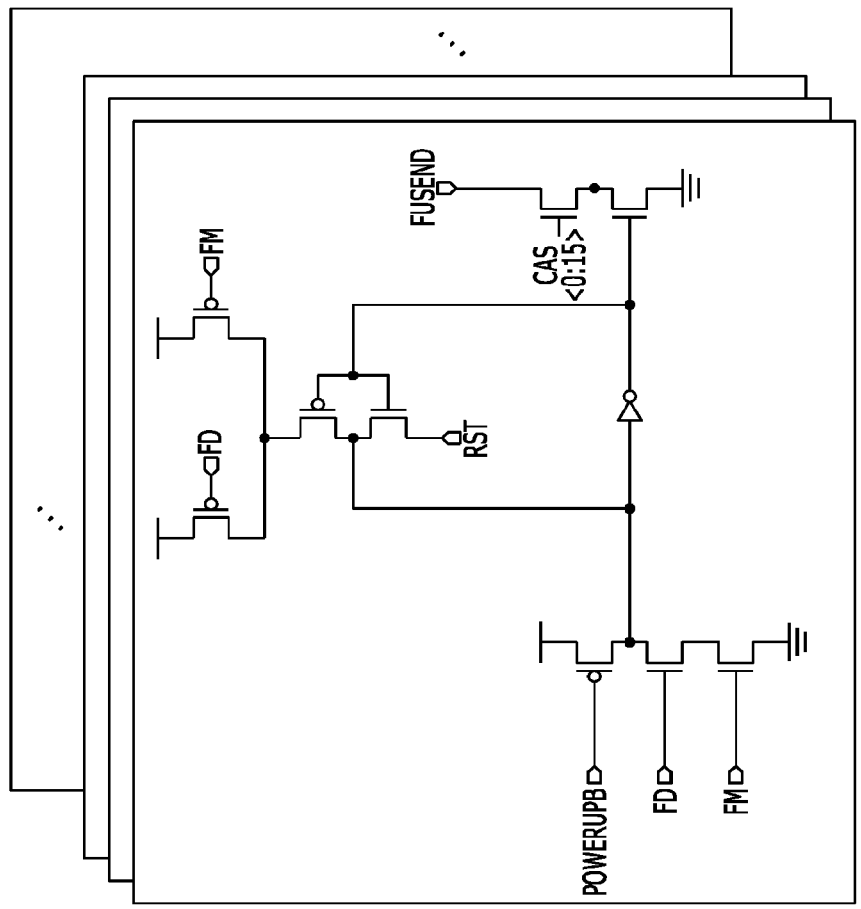
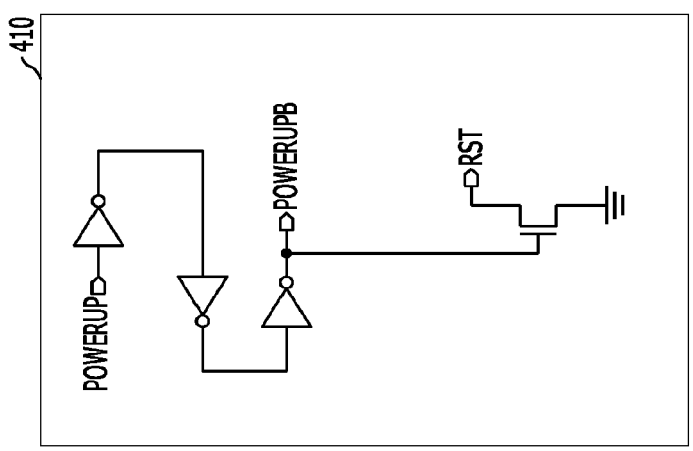

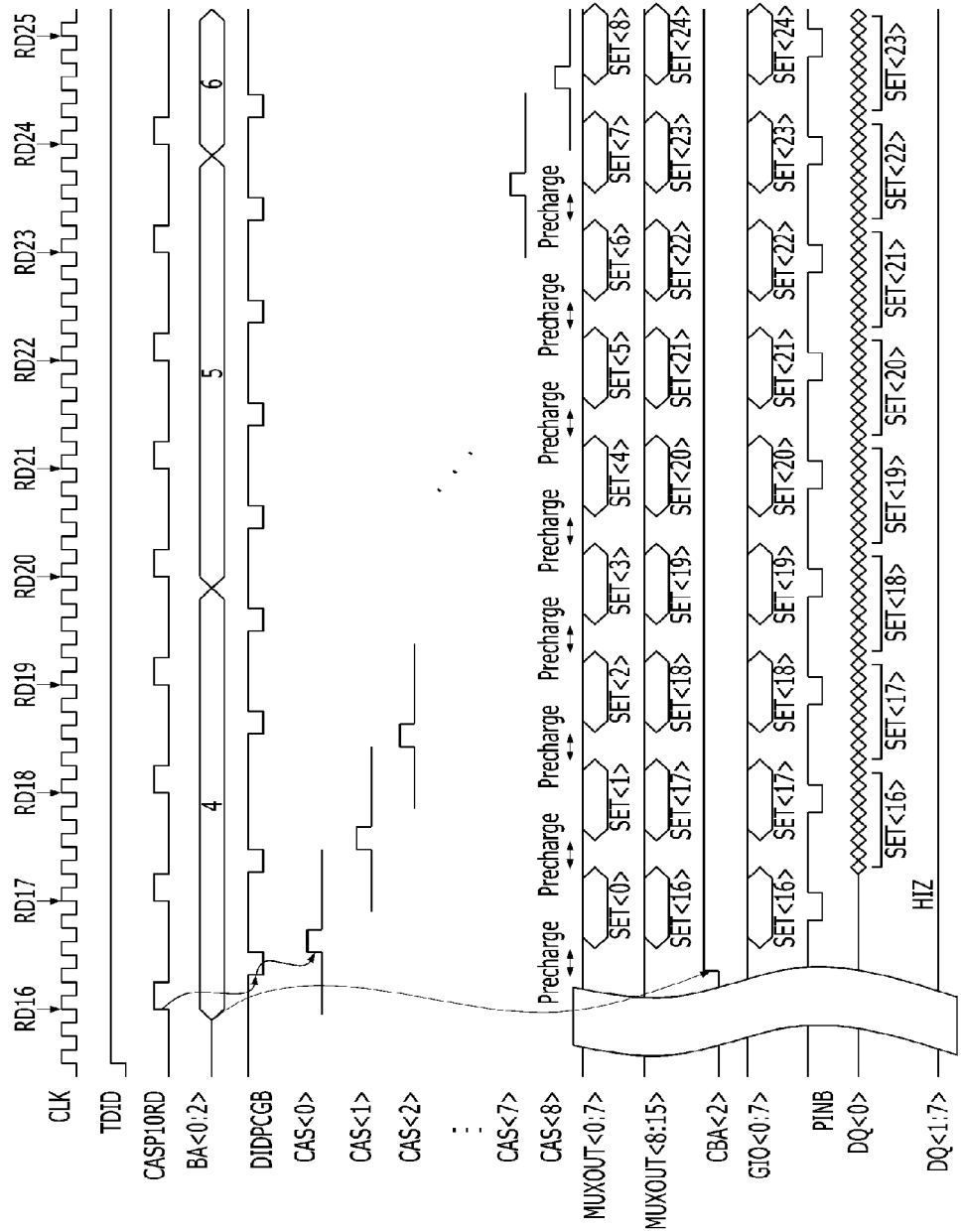

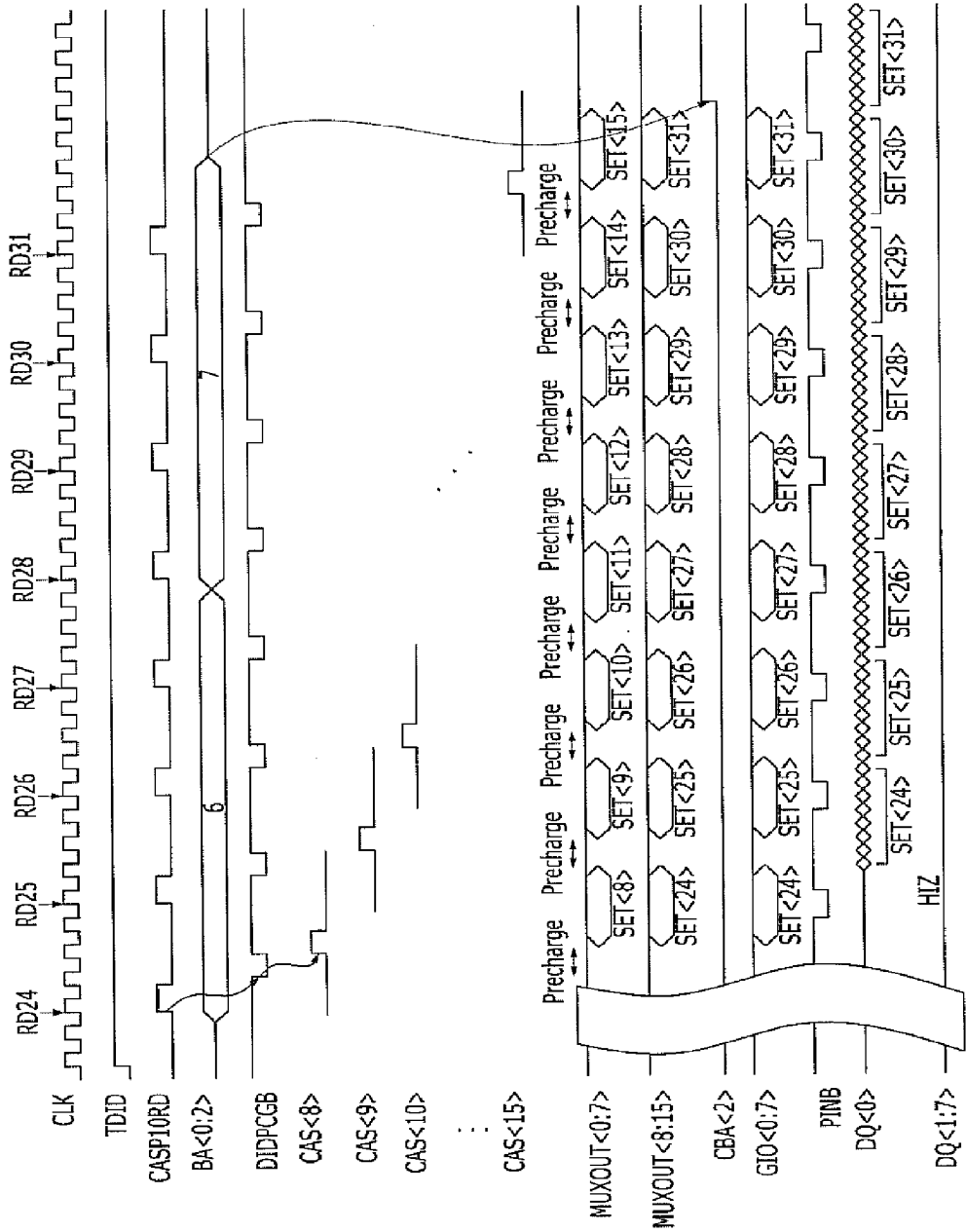

US 9,240,246 B2

SEMICONDUCTOR DEVICE HAVING FUSE CIRCUIT

CROSS-REFERENCE TO RELATED APPLICATIONS

The present application claims priority of Korean Patent Application No. 10-2013-0148516, filed on Dec. 2, 2013, which is incorporated herein by reference in its entirety.

BACKGROUND

1. Field

Various embodiments of the present invention relate to a semiconductor design technology, and more particularly, to a semiconductor device having a fuse circuit.

2. Description of the Related Art

As the integration of a semiconductor devices increase, the amount of information which is stored to set operation conditions of increases as well. In general, a fuse circuit is widely used for storing various pieces of information to set the semiconductor device operation conditions.

The fuse circuit stores redundancy information for defective memory cells in the semiconductor device, DC level trimming information, mode register set (MRS) information, test result information, and die-identification (die-ID) information.

Fuse circuits include laser fuse circuits, electrical fuse circuit s and anti-fuse circuits. The laser fuse circuit determines the connection state of the fuses through laser blowing. The electrical fuse circuit and the anti-fuse circuit determine the connection state of the fuses using an electrical signal for rupturing the fuses.

The test result information may be included in the various information stored on the fuse circuit since the information, e.g., a probe test result, which is tested during an initial fabrication process of the semiconductor device, may be used for a test operation performed after the semiconductor device is packaged. That is, after the test result information according to the probe test result is stored on the fuse circuit, and the semiconductor is packaged, since the test operation is performed by reading the information stored on the fuse circuit, the test result information is included in the information stored on the fuse circuit.

A die-identification (die-ID) fuse circuit is a fuse circuit for storing the die-ID information. The die-ID fuse circuit stores the die-ID information and performs an output operation of the stored data through a data pad, which is set by a test operation after the semiconductor device is packaged. The die-ID fuse circuit may further store the test result information.

The amount of the information (e.g., the die-ID information) stored on the die-ID fuse circuit has increased and, correspondingly, so has the area occupied by the fuse circuit. Thus, a circuit configuration for optimizing the area of a fuse circuit and performing an efficient operation is in demand.

SUMMARY

Various embodiments of the present invention are directed to a semiconductor memory device that minimizes the area occupied by the fuse circuit and contributes to efficient fuse circuit operation.

In accordance with an embodiment of the present invention, a semiconductor device may include a fuse array with a plurality of fuses; a common signal generation unit suitable for receiving a power-up signal, and generating an inverted power-up signal, and a reset signal; a plurality of fuse registers suitable for latching a plurality of fuse data for the plurality of fuses, and receiving commonly the inverted power-up signal and the reset signal from the common signal generation unit by grouped fuse registers; and an output selection unit suitable for outputting the plurality of fuse data stored on the plurality of fuse registers according to a predetermined sequence.

In accordance with an embodiment of the present invention, a semiconductor device may include a fuse array with a plurality of fuses; a common signal generation unit suitable for receiving a power-up signal and generating an inverted power-up signal and a reset signal; first to $N^{th}$ first registers suitable for latching first to $N^{th}$ first fuse data for first to $N^{th}$ fuses out of the plurality of fuses; and commonly receiving the inverted power-up signal and the reset signal from the common signal generation unit; first to $N^{th}$ second registers suitable for latching first to $N^{th}$ second fuse data for second $N+1^{th}$ to $2N^{th}$ fuses out of the plurality of fuses, and commonly receiving the inverted power-up signal and the reset signal from the common signal generation unit; and an output selection unit suitable for outputting the first to $N^{th}$ first fuse data according to a predetermined sequence, and outputting the first to $N^{th}$ second fuse data according to the predetermined sequence.

BRIEF DESCRIPTION OF THE DRAWINGS

FIG. 6 is a detailed diagram of a fuse register included in the die-ID fuse circuit shown in FIG. 4.

FIGS. 8A to 8D are timing diagrams for describing an operation of the die-ID fuse circuit shown in FIGS. 4 to 7.

DETAILED DESCRIPTION

Figure 1:
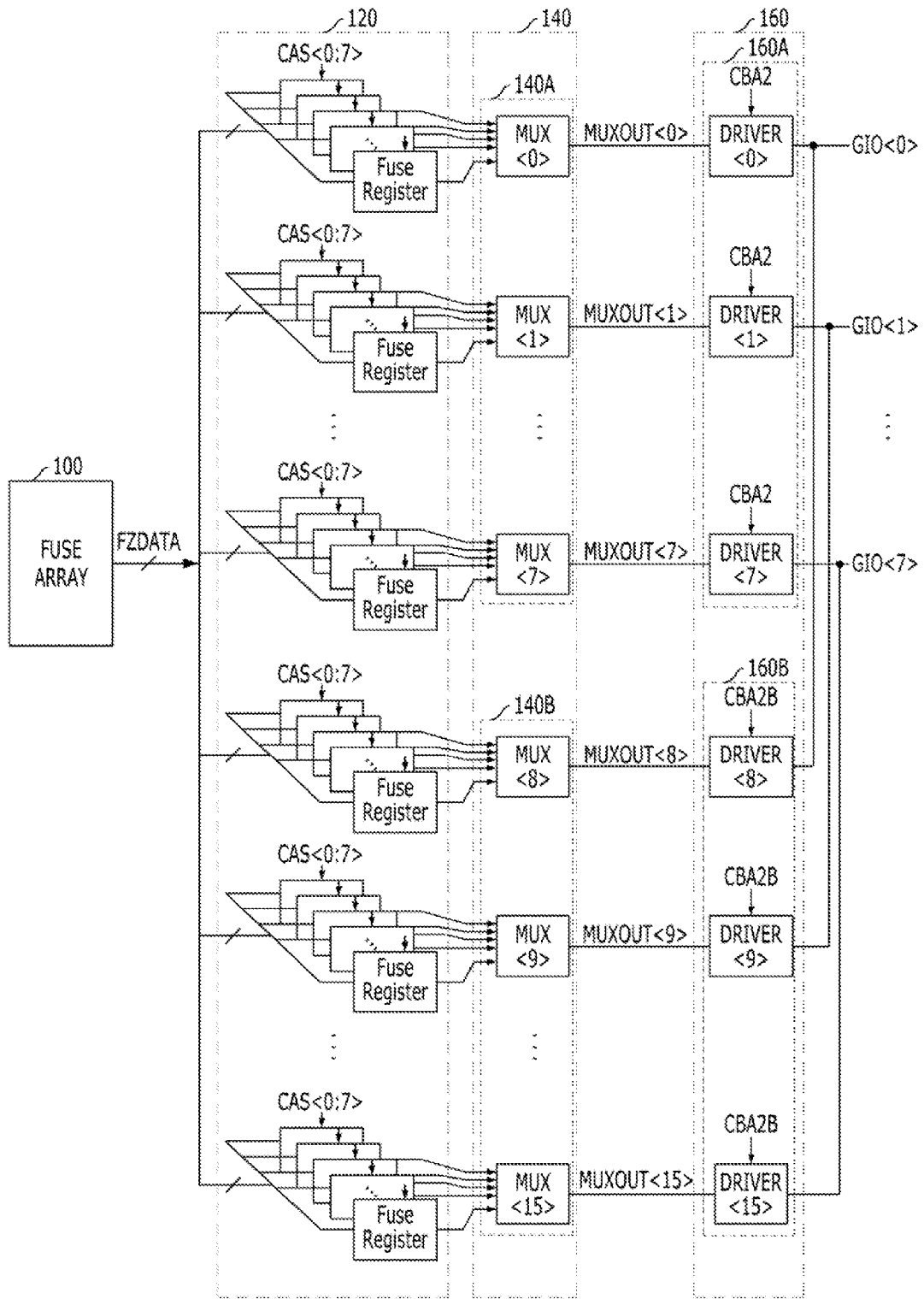
FIG. 1 is a block diagram illustrating a die-ID fuse circuit.

Exemplary embodiments of the present invention will be described below in more detail with reference to the accompanying drawings. The present invention may, however, be embodied in different forms and should not be construed as limited to the embodiments set forth herein. Rather, these embodiments are provided so that this disclosure will be thorough and complete, and will fully convey the scope of the present invention to those skilled in the art. Throughout the disclosure, reference numerals correspond directly to the like numbered parts in the various figures and embodiments of the present invention.

The drawings are not necessarily to scale and in some instances, proportions may have been exaggerated in order to clearly illustrate features of the embodiments. In this specification, specific terms have been used. The terms are used to describe the present invention and are not used to qualify the sense or limit the scope of the present invention.

It is also noted that in this specification, 'and/or' represents that one or more of components arranged before and after 'and/or' is included. Furthermore, "connected/coupled" refers to one component not only directly coupling another component but also indirectly coupling another component through an intermediate component. In addition, a singular form may include a plural form as long as it is not specifically mentioned in a sentence. Furthermore, 'include/comprise' or 'including/comprising' used in the specification represents that one or more components, steps, operations, and elements exists or are added.

FIG. 1 is a block diagram illustrating a die-ID fuse circuit.

Referring to FIG. 1, the die-ID fuse circuit includes a fuse array 100, a fuse latch unit 120, an output selection unit 140, and an output driving unit 160.

The fuse array 100 stores fuse data (or a fuse cutting information) FZDATA including die-ID information. If a boot-up operation is performed, the fuse array 100 outputs the fuse data FZDATA having a plurality of bits stored on a plurality of fuses (not shown) included in the fuse array 100. For example, 128 fuses (not shown) may be included in the fuse array 100 and the fuse data FZDATA having 128 bits may be outputted.

The fuse latch unit 120 receives and latches the fuse data FZDATA outputted from the fuse array 100 in response to a driving pulse CAS<0:7> during a boot-up operation period. Since the fuse data FZDATA has 128 bits, the number of fuse registers included in the fuse latch unit 120 may be 128.

The output selection unit 140 sequentially selects and outputs the fuse data FZDATA latched in the fuse latch unit 120. That is, 128 fuse registers are sequentially selected and enabled so that the fuse data having 128 bits latched in the fuse latch unit 120 is outputted according to a predetermined sequence. The output selection unit 140 groups and selects the 128 fuse registers included in the fuse latch unit 120 through 16 multiplexers MUX<0:15>.

The output driving unit 160 transmits output signals MUXOUT<0:15> of the output selection unit 140 to global lines GIO<0:7>. Herein, 16 multiplexers MUX<0:15> included in the output selection unit 140 are classified into a first multiplexer group 140A having eight multiplexers MUX<0:7> and a second multiplexer group 140B having eight multiplexers MUX<8:15>, and coupled to 16 drivers DRIVER<0:15>. The 16 drivers DRIVER<0:15> are classified into a first driving group 160A having eight drivers DRIVER<0:7> and a second driving group 160B having eight drivers DRIVER<8:15>, and coupled to the eight global lines GIO<0:7>. That is, the first driving group 160A and the second driving group 160B of the output driving unit 160 transmit alternately first output signals MUXOUT<0:7> and second output signals MUXOUT<8:15> outputted from eight multiplexers MUX<0:7> of the first multiplexer group 140A and eight multiplexers MUX<8:15> of a second multiplexer group 140B, respectively, to the eight global lines GIO<0:7> in response to first and second control signals CBA2 and CBA2B. For reference, it is assumed that the number of global lines GIO<0:7> are serialized and outputted through one data pad (not shown). The number of global lines may be changed according to a selection of a designer.

Figure 2:
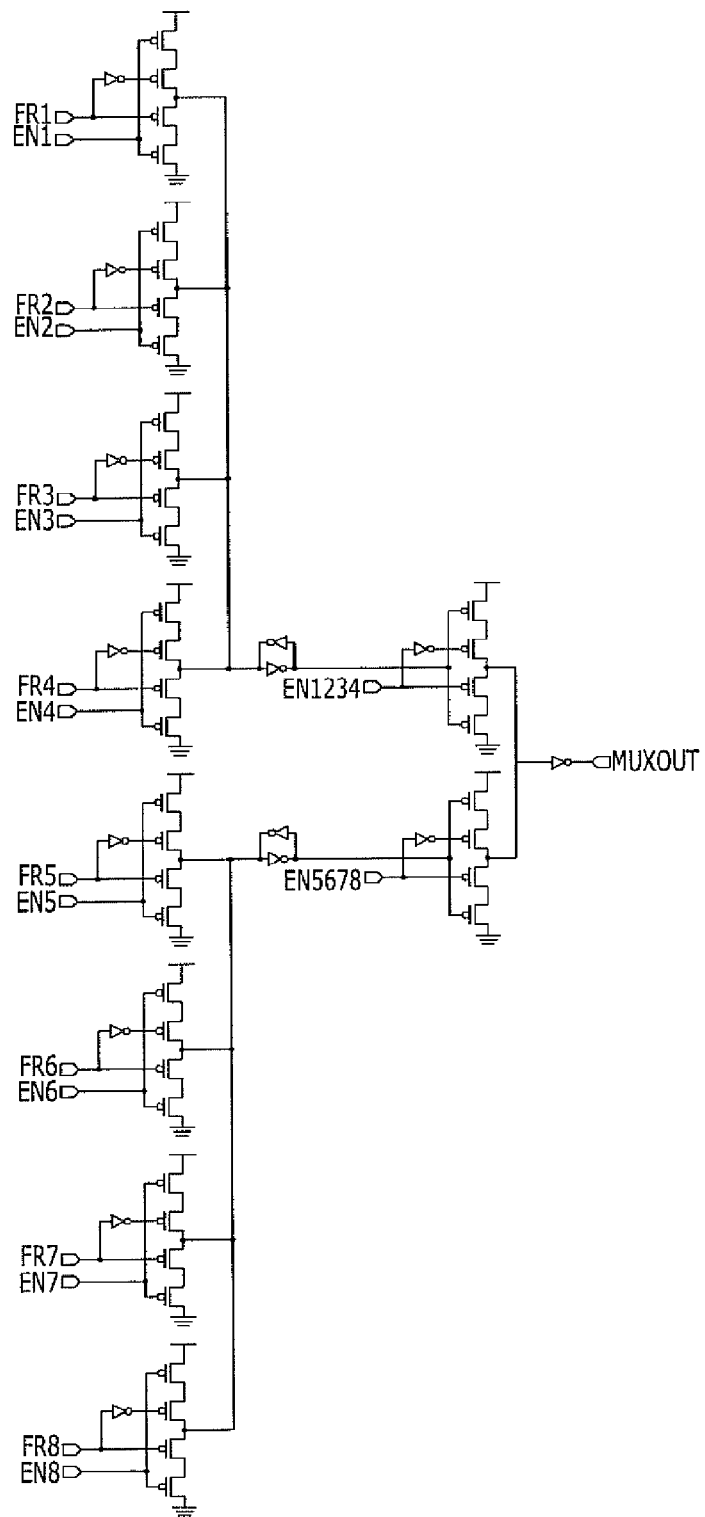
FIG. 2 is a detailed diagram of a multiplexer included in the die-ID fuse circuit shown in FIG. 1.

FIG. 2 is a detailed diagram of a multiplexer included in the die-ID fuse circuit shown in FIG. 1.

Referring to FIG. 2, each of the 16 multiplexers MUX<0:15> of the die-ID fuse circuit shown in FIG. 1 performs eight to one multiplexing operation to sequentially select the fuse data FZDATA outputted from the eight fuse registers, and outputs output signals MUXOUT.

The multiplexers MUX<0:15> may be a clocked inverter and latch type multiplexer, which is used for selecting one of a plurality of signals. For reference, FR1 to FR8 denote output signals of the fuse registers, and EN1 to EN8, EN1234, and EN5678 denote enable signals for a selective output operation.

Figure 3:
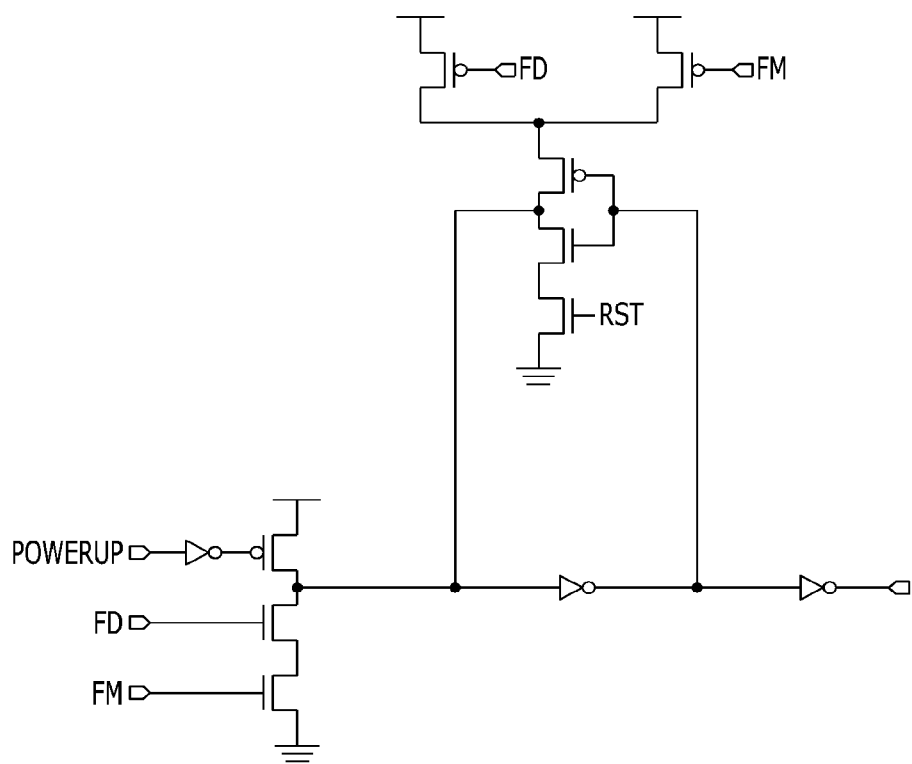
FIG. 3 is a detailed diagram of a fuse register included in the die-ID fuse circuit shown in FIG. 1.

FIG. 3 is a detailed diagram of a fuse register included in the die-ID fuse circuit shown in FIG. 1.

Referring to FIG. 3, a value latched in the fuse register may be changed in response to signals FD and FM which have a value that corresponds to the fuse data FZDATA outputted from the fuse array 100.

More specifically, when a power-up signal POWERUP has a logic high level, a logic high level is latched in the fuse register. Herein, while the power-up signal POWERUP has the logic high level, a reset signal RST becomes a logic low level. When the logic high level is latched in the fuse register, a current path is prevented from being formed and having a logic high level.

If the signals FD and FM corresponding to the fuse data FZDATA have logic high levels, a logic high level value latched in the fuse register is changed to a logic low level. When the logic low level value is latched in the fuse register, it is blocked from forming a current path and having a logic high level value.

On the other hand, if any one of signals FD and FM corresponding to the fuse data FZDATA outputted from the fuse array has a logic low level, the logic high level of the data is maintained As described above, through FIGS. 1 to 3, the die-ID fuse circuit occupying a small area may output fuse data FZDATA efficiently to an external device (e.g., a memory controller) by transmitting the fuse data FZDATA stored on the fuse array 100 to the global lines GIO<0:7>.

However, it is assumed that the fuse data FZDATA stored on the fuse array 100 shown in FIGS. 1 to 3 have 128 bits, and as the number of bits of the fuse data FZDATA increases, the area occupied by the die-ID fuse circuit increases. For example, as the number of input signals selected by the plurality of multiplexers MUX<0:15> included in the output selection unit 140 increases, the area occupied by the die-ID fuse circuit increases.

In embodiments of the present invention, although the number of bits of the fuse data FZDATA increases, a die-ID fuse circuit for minimizing the increase in area may be provided.

Figure 4:
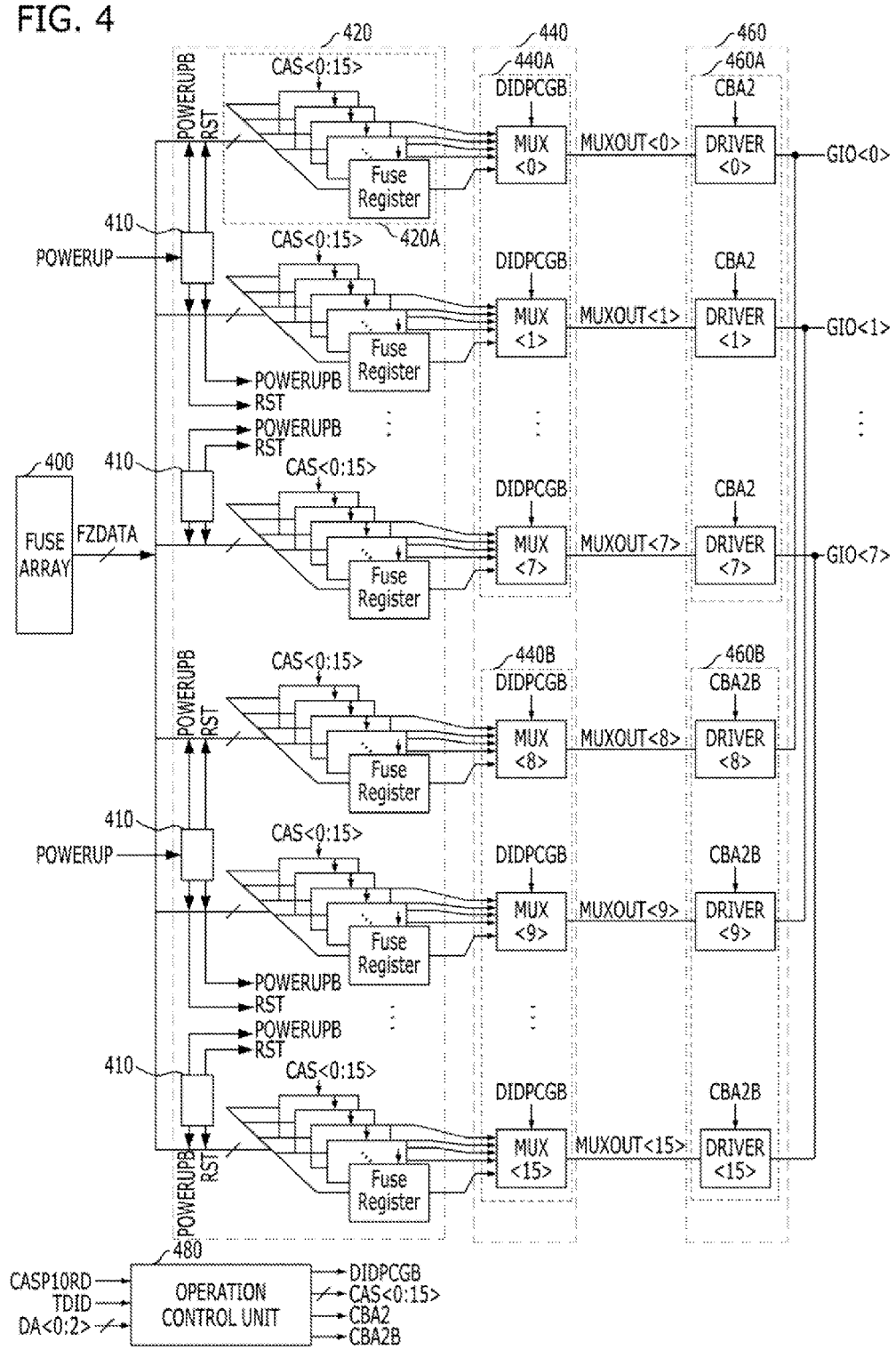
FIG. 4 is a block diagram illustrating a die-ID fuse circuit in accordance with an embodiment of the present invention.

FIG. 4 is a block diagram illustrating a die-ID fuse circuit in accordance with an embodiment of the present invention.

Referring to FIG. 4, the die-ID fuse circuit may include a fuse array 400, a common signal generation unit 410, a fuse latch unit 420, an output selection unit 440, an output driving unit 460, and an operation control unit 480.

The fuse array 400 stores fuse data FZDATA having die-ID information. The fuse data FZDATA may include test result information. If a boot-up operation is performed, the fuse array 400 outputs the fuse data FZDATA including a plurality of bits stored on a plurality of fuses (not shown) included in the fuse array 400. For example, 256 fuses (not shown) may be included in the fuse array 400 and fuse data having 256 bits may be outputted.

The common signal generation unit 410 receives a power-up signal POWERUP and generates and provides an inverted power-up signal POWERUPB and a reset signal RST to the fuse latch unit 420. The common signal generation unit 410 will be described in detail with reference to FIG. 6.

The fuse latch unit 420 receives and latches the fuse data FZDATA outputted from the fuse array 400 during a boot-up operation period. Since the fuse data FZDATA has 256 bits, the number of fuse registers included in the fuse latch unit 420 may be 256.

Moreover, the 256 fuse registers included in the fuse latch unit 420 are classified into 4 groups of 64 fuse registers, which commonly receive an inverted power-up signal POWERUPB and the reset signal RST from the common signal generation unit 410. The 256 fuse registers are reset in response to the inverted power-up signal POWERUPB and the reset signal RST before the fuse data FZDATA having 256 bits outputted from the fuse array 400 are latched. Since an operation period, which is reset by the inverted power-up signal POWERUP and the reset signal RST, has a sufficient time length, the size of MOS transistor for receiving the inverted power-up signal POWERUPB and the reset signal RST is small. However, as shown in FIG. 3, if each of the fuse registers uses a plurality of MOS transistors for receiving the power-up signal POWERUP and the reset signal RST, the area of the fuse array 400 may be increased. Thus, the embodiment of the present invention shown in FIG. 4 is proposed, 256 fuse registers shown in FIG. 4 are classified into 4 groups having 64 fuse registers, and the 64 fuse registers included in each group receive commonly the inverted power-up signal POWERUPB and the reset signal RST from the corresponding common signal generation unit 410.

The output selection unit 440 sequentially selects and outputs the fuse data FZDATA latched in the fuse latch unit 420. That is, 256 fuse registers are sequentially selected and enabled so that the fuse data having 256 bits latched in the fuse latch unit 420 is outputted according to a predetermined sequence. The output selection unit 440 groups and selects the 256 fuse registers included in the fuse latch unit 420 through 16 multiplexers MUX<0:15>. Thus, the 16 multiplexers MUX<0:15> output sequentially the fuse data FZDATA, which are paralyzed with 16 bits, in serial 16 times. That is, fuse data FZDATA having a total of 256 bits are outputted from the output selection unit 440.

The output driving unit 460 transmits output signals MUXOUT<0:15> of the output selection unit 440 to global lines GIO<0:7>. The 16 multiplexers MUX<0:15> included in the output selection unit 440 are classified into a first multiplexer group 440A having eight multiplexers MUX<0:7> and a second multiplexer group 440B having eight multiplexers MUX<8:15>, and coupled to 16 drivers DRIVER<0:15>. The 16 drivers DRIVER<0:15> are classified into a first driving group 460A having eight drivers DRIVER<0:7> and a second driving group 460B having eight drivers DRIVER<8:15>, and coupled to the eight global lines GIO<0:7>. That is, the first driving group 460A and the second group 460B of the output driving unit 460 transmit alternately first output signals MUXOUT<0:7> and second output signals MUXOUT<8:15> outputted from eight multiplexers MUX<0:7> of the first multiplexer group 440A and eight multiplexers MUX<8:15> of the second multiplexer group 440B, respectively, to the eight global lines GIO<0:7> in response to the first and second control signals CBA2 and CBA2B. For reference, it is assumed that the number of global lines GIO<0:7> are serialized and outputted through one data pad (not shown). The number of global lines may be changed according to the selection of a designer.

The operation control unit 480 generates various control signals, e.g., a precharge pulse signal DIDPCGB, a driving pulse CAS<0:15>, a first control signal CBA2 and a second control signal CBA2B, to sequentially operate the die-ID fuse circuit. More specifically, when an enable signal TDID for determining an operation enable state of the die-ID fuse circuit is activated, the various control signals DIDPCGB, CAS<0:15>, CBA2 and CBA2B may be generated normally. If the enable signal TDID for determining the operation enable state of the die-ID fuse circuit is inactivated, the various control signals DIDPCGB, CAS<0:15>, CBA2 and CBA2B may be maintained with an inactivated state. The operation control unit 480 generates the driving pulse CAS<0:15> and the precharge pulse signal DIDPCGB for controlling a perecharge operation of each of 15 multiplexers MUX<0:15> included in the output selection unit 440 in response to a predetermined command signal CASP10RD. The precharge operation of the 16 multiplexers MUX<0:15> will be described in detail later. The first and second control signals CBA2 and CBA2B for grouping the 16 multiplexers MUXM0:15> are generated in response to address signals DA<0:2>.

Figure 5:
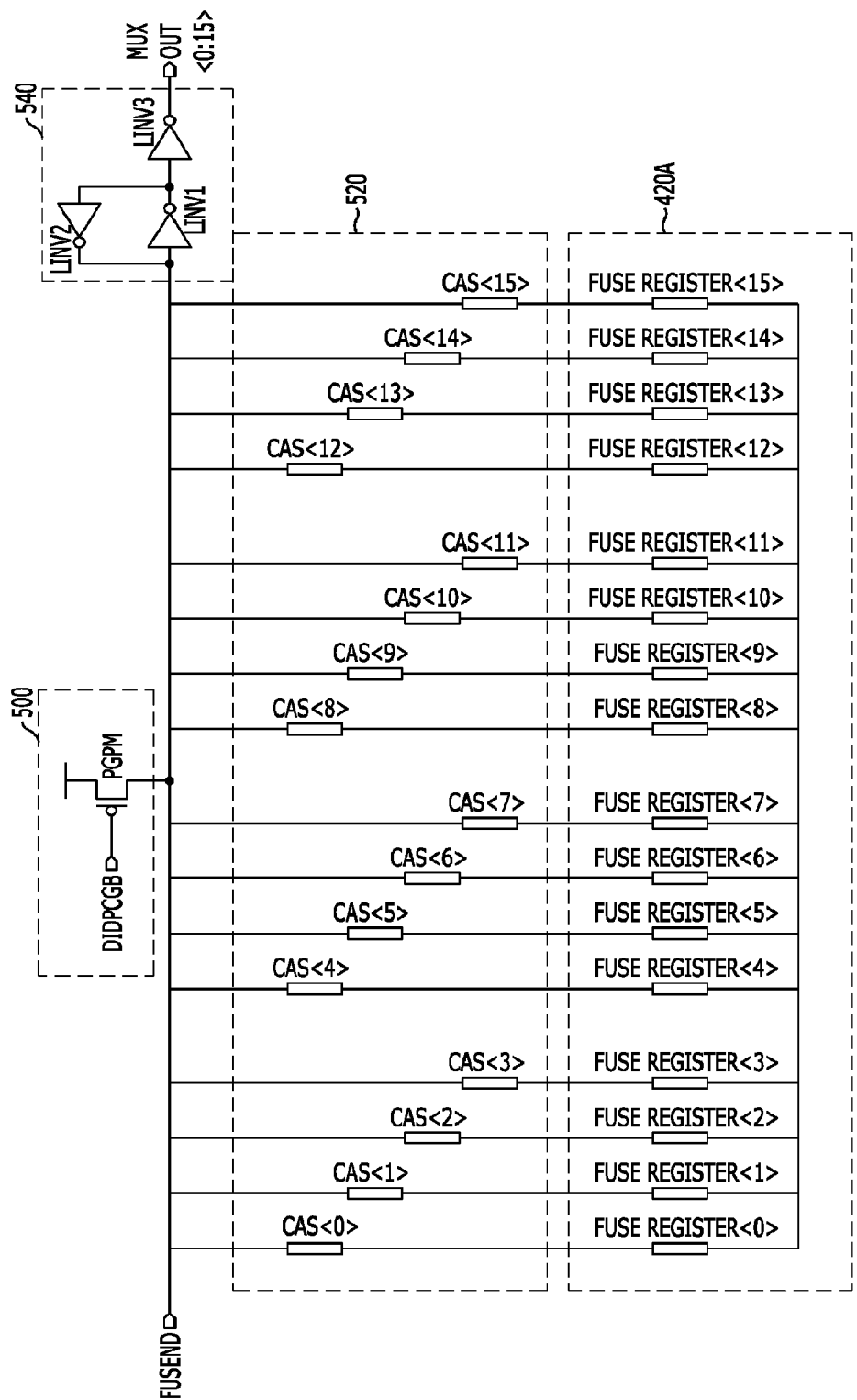
FIG. 5 is a detailed diagram of a multiplexer included in the die-ID fuse circuit shown in FIG. 4.

FIG. 5 is a detailed diagram a multiplexer included in the die-ID fuse circuit shown in FIG. 4.

Referring to FIGS. 4 and 5, each of the 16 multiplexers MUX<0:15> included in the output selection unit 440 of the die-ID fuse circuit performs a multiplexing operation of 16 to 1 to sequentially select the fuse data FZDATA outputted from 16 fuse registers FUSE REGISTER<0:15>.

The 16 multiplexers MUX<0:15> shown in FIG. 4 may be precharge/evaluate type multiplexers. More specifically, whenever the 16 multiplexers MUX<0:15> receive the predetermined command signal CASP10RD, the 16 multiplexers MUX<0:15> precharge an evaluation node FUSEND, performs a grouping on 256 fuse data FZDATA stored on the 256 fuse registers by 16 grouped fuse registers 420A and drives the evaluation node FUSEND according to a predetermined sequence, e.g., 0→1→2→ . . . →15. A logic level value of the fuse data FZDATA driven to the evaluation node FUSEND according to the predetermined sequence is determined, and is outputted as output values MUXTOUT<0:15>.

For such an operation, each of the 16 multiplexers MUX<0:15> may include a precharge unit 500, a driving unit 520, and an evaluation unit 540.

The precharge unit 500 precharges the evaluation node FUSEND whenever the precharge pulse DIDPCGB is toggled in response to the predetermined command signal CASP10RD. That is, the precharge unit 500 precharges the evaluation node FUSEND to a logic high level in response to the precharge pulse DIDPCGB having a logic low level whenever the predetermined command signal CASP10RD is received. For reference, the precharge unit 500 may include a PMOS transistor PGPM.

The driving unit 520 performs a grouping on the fuse data FZDATA stored on the 256 fuse registers by the 16 grouped fuse registers 420A and drives the grouped fuse data FZDATA to the evaluation node FUSEND according to the predetermined sequence, e.g., 0→1→2→ . . . →15, whenever 16 driving pulses CAS<0:15> is toggled in response to an end of toggling of the precharge pulse DIDPCGB. That is, whenever the 16 driving pulses CAS<0:15> are sequentially toggled, e.g., CAS<0>->CAS<2>-> . . . ->CAS<15>, the 16 fuse registers FUSE REGISTER<0:15> included in each of the 16 grouped fuse registers 420A are sequentially enabled and the stored fuse data FZDATA are driven to the evaluation node FUSEND.

The evaluation determining unit 540 determines a logic level value of the evaluation node FUSEND and outputs a determined logic level value during a toggling period of the 16 driving pulses CAS<0:15>. That is, the evaluation determining unit 540 determines the logic level value of the evaluation node FUSEND when the fuse data FZDATA stored on the 16 fuse registers FUSE REGISTER<0:15> are driven to the evaluation node FUSEND. For reference, the evaluation determining unit 540 may include three inverters LINV1 to LINV3 that may form a latch.

Such an operation will be summarized as below.

After the evaluation node FUSEND is precharged to the logic high level when the precharge pulse DIDPCGB is toggled, a first driving pulse CAS<0> of the 16 driving pulses CAS<0:15> is toggled, the fuse data stored on a first fuse register FUSE RESISTER<0> of the 16 fuse registers FUSE RESISTER<0:15> is driven to the evaluation node FUSEND, and the logic level value of the evaluation node FUSEND is determined and outputted. Subsequently, after the evaluation node FUSEND is precharged to the logic high level when the precharge pulse DIDPCGB is toggled, a second driving pulse CAS<1> of the 16 driving pulses CAS<0:15> is toggled, the fuse data stored on a second fuse register FUSE RESISTER<1> of the 16 fuse registers FUSE RESISTER<0: 15> is driven to the evaluation node FUSEND, and the logic level value of the evaluation node FUSEND is determined and outputted. Through such a manner, the fuse data stored on a last fuse register FUSE RESISTER<15> of the 16 fuse registers FUSE RESISTER<0:15> is driven to the evaluation node FUSEND and the logic level value of the evaluation node FUSEND is determined and outputted.

For reference, one of the 16 multiplexers MUX<0:15> is shown in FIG. 5. Thus, the 16 multiplexers MUX<0:15> may have the same configurations. Especially, since the 16 multiplexers MUX<0:15> receive commonly control signals DIDPCGB and CAS<0:15>, their operation timings are same.

FIG. 6 is a detailed diagram of the fuse registers included in the die-ID fuse circuit shown in FIG. 4.

Referring to FIG. 6, the logic values of the fuse data FZDATA latched in 64 fuse registers may be changed in response to the signals FD and FM corresponding to the fuse data FZDATA outputted from the fuse array 400. The 64 fuse registers may commonly receive the inverted power-up signal POWERUPB and the reset signal RST. Although all of 256 fuse registers are not shown in FIG. 6, referring to FIGS. 4 and 6, the 256 fuse registers are classified to four groups having 64 fuse registers, and the 64 fuse registers included in each group receive the inverted power-up signal POWERUPB and the reset signal RST commonly.

More specifically, the 64 fuse registers receive the inverted power-up signal POWERUPB and the reset signal RST commonly from the common signal generation unit 410. The common signal generation unit 410 generates the inverted power-up signal POWERUPB by inverting the power-up signal POWERUP, and generates the reset signal RST, which maintains an inactivation state during an activation period of the power-up signal POWERUP, and an activation state during an inactivation period of the power-up signal POWERUP. That is, when the power-up signal POWERUP is activated, the reset signal RST is inactivated, and when the power-up signal POWERUP is inactivated, the reset signal RST is activated.

The common signal generation unit 410 generates and provides the inverted power-up signal POWERUPB to the 64 fuse registers. The common signal generation unit 410 generates and provides the reset signal RST depending on the activation of the power-up signal POWERUP to the 64 fuse registers. The common signal generation unit 410 includes three inverters and one MOS transistor. Each of the 64 fuse registers includes an inverter for inverting the inverted power-up signal POWERUPB to the power-up signal POWERUP, and a MOS transistor for adjusting current path of the fuse register in response to the reset signal RST.

The inactivation state of the reset signal RST may be a floating state, or the logic level value, e.g., logic high level value, to be latched as the reset value in the fuse registers. The activation state of the reset signal RST may be an inverted value, e.g., a logic low level, of the logic level value to be latched as the reset value in the fuse registers. For reference, it is exemplarily shown in FIG. 6 that the inactivation state of the reset signal RST is the floating state.

If the power-up signal POWERUP is activated to the logic high level, the inverted power-up signal POWERUPB is activated to the logic low level, and the logic high level value is latched in each of the 64 fuse registers. When the power-up signal POWERUP is activated to the logic high level, the reset signal RST is inactivated to the floating state or the logic low level. Thus, when the logic high level value is latched in each of the 64 fuse registers, the current path is blocked from being formed in the logic low level.

If the signals FD and FM corresponding to the fuse data FZDATA outputted from the fuse array 400 become the logic high level after each of the 64 fuse registers is reset in response to the power-up signal POWERUP, the logic high level value latched in the fuse registers may be changed to the logic low level value. Herein, since the signals FD and FM corresponding to the fuse data FZDATA become the logic high level, the current path is blocked from being formed in the logic high level when the logic low level value is latched in the fuse registers.

On the other hand, if one of the signals FD and FM corresponding to the fuse data FZDATA outputted from the fuse array 400 becomes the logic low level, the logic high level latched in the fuse registers are maintained.

If the driving pulses CAS<0:15> corresponding to each of the 64 fuse registers are received after the logic level value, latched in each of the 64 fuse registers corresponding to the fuse data FZDATA outputted from the fuse array 400, is determined, the logic level value latched in the 64 fuse registers are transmitted to the evaluation node FUSEND.

For reference, although the 64 fuse registers are shown in FIG. 6, if the number of fuse registers is 256 as shown in FIG. 4, four times the 64 fuse registers shown in FIG. 6 will be shown. For the convenience of the descriptions, the 64 fuse registers receive the inverted power-up signal POWERUPB and the reset signal RST. However, more or less than 64 fuse registers may commonly receive the inverted power-up signal POWERUPB and the reset signal RST.

Figure 7:
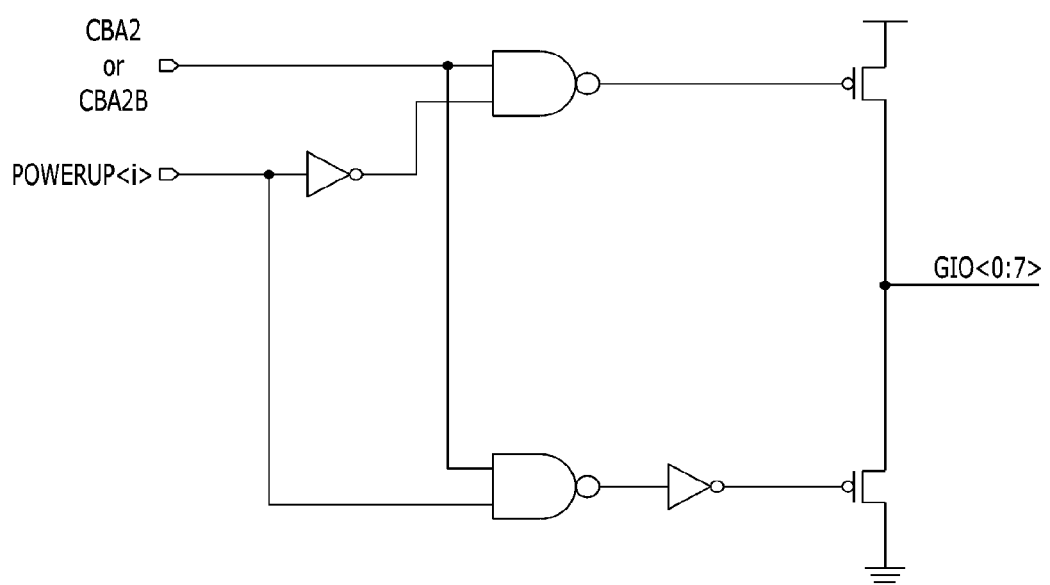
FIG. 7 is a detailed diagram of an output driving unit included in the die-ID fuse circuit shown in FIG. 4.

FIG. 7 is a detailed diagram of an output driving unit DRIVER<i> included in the die-ID fuse circuit shown in FIG. 4.

Referring to FIG. 7, the output driving unit 460 of the die-ID fuse circuit shown in FIG. 4 receives first and second control signals CBA2 and CBA2B and transmits the output signals MUXOUT<0:15> of the 16 multiplexers MUX<0: 15> included in the output selection unit 440 to the 8 global lines GIO<0:7> through two steps in response to the first and second control signal CBA2 and CBA2B. More specifically, the 8 multiplexers MUX<0:7> included in the first multiplexer group 440A of the output selection unit 440 are transmitted to the 8 global lines GIO<0:7> in response to the first control signal CBA2. Moreover, the 8 multiplexers MUX<8: 15> included in the second multiplexer group 440B of the output selection unit 440 are transmitted to the 8 global lines GIO<0:7> in response to the second control signal CBA2B.

In other words, the 8 drivers DRIVER<0:7> included in the first driving group 460A of the output driving unit 460 transmits the output signals MUXOUT<0:7> of the multiplexers MUX<0:7> included in the first multiplexer group 440A of the output selection unit 440 to the 8 global lines GIO<0:7> in response to the first control signal CBA2. Since the drivers DRIVER<8:15> included in the second driving group 460B of the output driving unit 460 do not perform any operation, the output signals MUXOUT<8:15> of the multiplexers MUX<8:15> included in the second multiplexer group 440B of the output selection unit 440 are not transmitted to the global lines GIO<0:7>.

The 8 drivers DRIVER<0:7> included in the second driving group 460B of the output driving unit 460 transmits the output signals MUXOUT<8:15> of the multiplexers MUX<8:15> included in the second multiplexer group 440B of the output selection unit 440 to the 8 global lines GIO<0:7> in response to the second control signal CBA2B. Since the drivers DRIVER<0:7> included in the first driving group 460A of the output driving unit 460 do not perform any operation, the output signals MUXOUT<0:7> of the multiplexers MUX<0:7> included in the first multiplexer group 440A of the output selection unit 440 are not transmitted to the global lines GIO<0:7>.

FIG. 7 shows one driver of the 16 drivers DRIVER<0:15> included in the output driving unit 460 of the die-ID fuse circuit shown in FIG. 4. The 16 drivers DRIVER<0:15> may have same configurations, but receive the first control signal CBA2 or the second control signal CBA2B according to the first driving group 460A or the second driving group 460B, respectively. Since it is assumed that the 8 global lines GIO<0:7> exist, the 16 drivers DRIVER<0:15> are classified into the first driving group 460A and the second driving group 460B of the output driving unit 460 and may alternately operate. As the number of global lines is varied, the number of groups of the output driving unit 460 may be varied.

FIGS. 8A to 8D are timing diagrams for describing an operation of the die-ID fuse circuit shown in FIGS. 4 to 7.

Referring to FIGS. 8A to 8D, an operation of the die-ID fuse circuit starts when the enable signal TDID is activated to the logic high level. The die-ID fuse circuit repeats the same operation in response to the predetermined command signal CASP10RD. Moreover, the operation of the die-ID fuse circuit shown in FIGS. 8A to 8D relates to the fuse latch unit 420, the output selection unit 440, the output driving unit 460 and the operation control unit 480. However, a process for storing the fuse data FZDATA of the fuse latch unit 420 is not shown in FIGS. 8A to 8D. The fuse data FZDATA ruptured on the fuse array 400 is stored on the fuse latch unit 420 before the die-ID fuse circuit operates in response to the activation of the enable signal TDID. In other words, although not shown in FIGS. 8A to 8D, since the boot-up operation starts after the power-up operation of the semiconductor device, the fuse data FZDATA having 256 bits ruptured on the fuse array 400 may be stored on the 256 fuse registers included in the fuse latch unit 420.

For reference, the operation of the die-ID fuse circuit is performed independently from the power-up operation and the boot-up operation of the semiconductor device. That is, the operation of the die-ID fuse circuit may be performed irrespective of the power-up operation and the boot-up operation at a predetermined time selected by a designer.

Figure 8A:
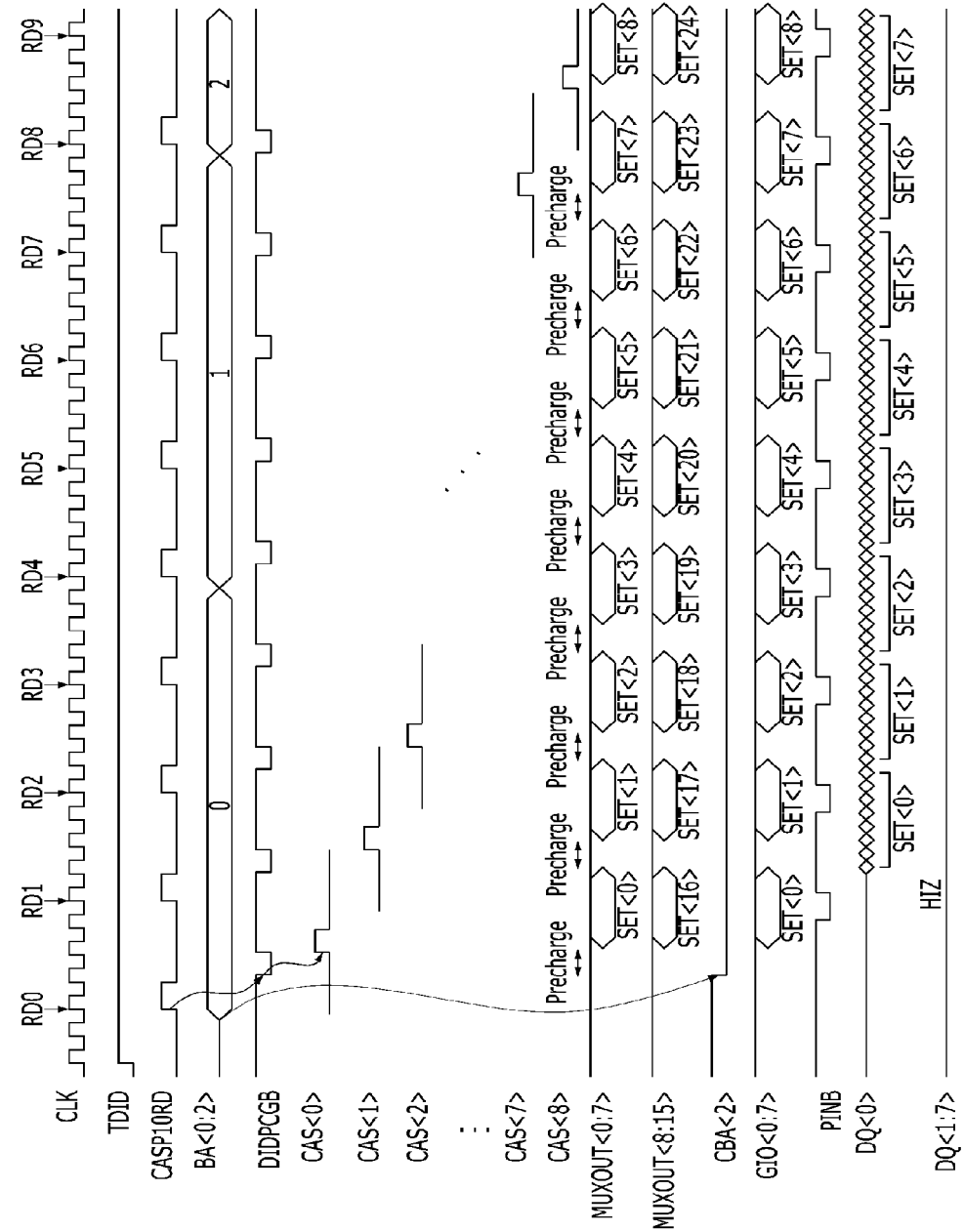
Figure 8B:
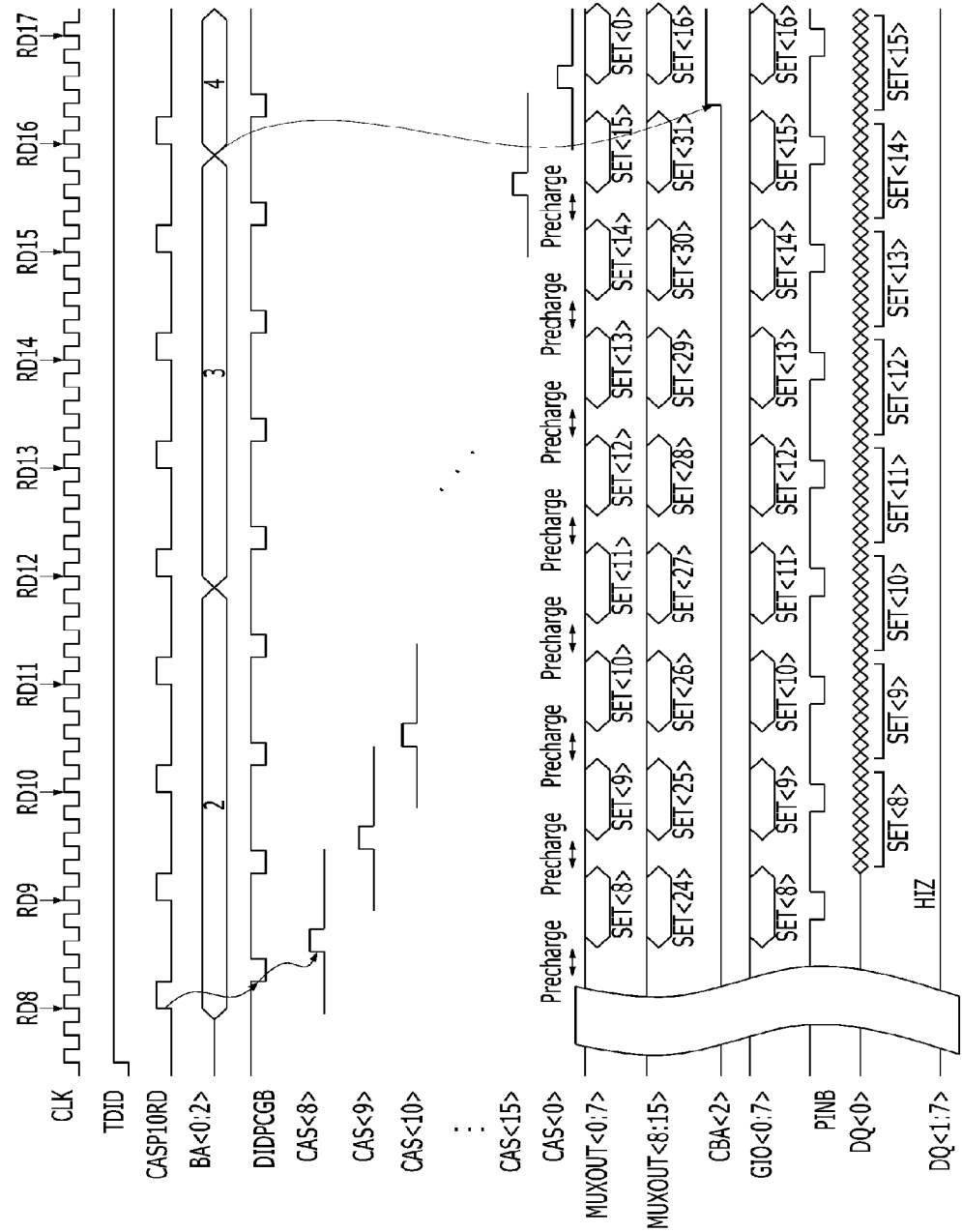

Firstly, referring to FIGS. 8A and 8B, after the enable signal TDID of the die-ID fuse circuit is activated to the logic high level, the precharge pulse DIDPCGB is toggled to the logic low level in response to the toggling of the logic high level of the predetermined command signal CASP10RD. Moreover, the 16 driving pulses CAS<0:15> is sequentially toggled to the logic high level in response to the toggling of the logic low level of the precharge pulse DIDPCGB.

The precharge pulse DIDPCGB is firstly toggled to the logic low level in response to the first toggling RD0 of the logic high level of the predetermined command signal. The first driving pulse CAS<0> of the 16 driving pulses CAS<0: 15> is firstly toggled to the logic high level in response to the first toggling of the logic low level of the precharge pulse DIDPCGB. Subsequently, the precharge pulse DIDPCGB is secondarily toggled to the logic low level in response to the second toggling RD1 of the logic high level of the predetermined command signal. The second driving pulse CAS<1> of the 16 driving pulses CAS<0:15> is secondarily toggled to the logic high level in response to the second toggling of the logic low level of the precharge pulse DIDPCGB. Through such a manner, the precharge pulse DIDPCGB is toggled to the logic low level at third to [[a]] sixteenth times in response to the third to sixteenth togglings RD2 to RD15 of the logic high level of the predetermined command signal, respectively. The sixteenth driving pulse CAS<15> of the 16 driving pulses CAS<0:15> is toggled to the logic high level at sixteenth time in response to the sixteenth toggling of the logic low level of the precharge pulse DIDPCGB.

Thus, the evaluation node FUSEND of each of the 16 multiplexers MUX<0:15> is precharged in response to the repeated activation of the precharge pulse DIDPCGB.

Subsequently, the fuse data FZDATA having 256 bits latched on the 256 fuse registers are sequentially loaded on the evaluation node FUSEND of each of the 16 multiplexers MUX<0:15> by 16 bits (SET<0>, SET<16>-->SET<1>, SET<17>-->SET<2>, SET<18>-->SET<3>, SET<19>-->SET<4>, SET<20>-->SET<5>, SET<21>-->SET<6>, SET<22>-->SET<7>, SET<23>-->SET<8>, SET<24>-->SET<9>, SET<25>-->SET<10>, SET<26>-->SET<11>, SET<27>-->SET<12>, SET<28>-->SET<13>, SET<29>-->SET<14>, SET<30>-->SET<15>, SET<31>).

The address signals BA<0:2> have a value of '0' to '3', the first control signal CBA2 is activated to the logic low level, and the second control signal CBA2 is inactivated to the logic high level. Thus, the fuse data FZDATA having 128 bits, which are sequentially loaded on the evaluation node FUSEND of each of the eight multiplexers MUX<0:7> included in the first multiplexer group 440A by 16 bits (SET<0>-->SET<1>-->SET<2>-->SET<3>-->SET<4>--> SET<5>-->SET<6>-->SET<7>-->SET<8>-->SET<9>--> SET<10>-->SET<11>-->SET<12>-->SET<13>--> SET<14>-->SET<15>), are sequentially transmitted to the eight global lines GIO<0:7>. On the other hand, the fuse data FZDATA having 128 bits, which are sequentially loaded on the evaluation node FUSEND of each of the eight multiplexers MUX<8:15> included in the second multiplexer group 440B by 16 bits (SET<16>-->SET<17>--> SET<18>-->SET<19>-->SET<20>-->SET<21>--> SET<22>-->SET<23>-->SET<24>-->SET<25>--> SET<26>-->SET<27>-->SET<28>-->SET<29>--> ET<30>-->SET<31>), are not transmitted to the global lines GIO<0:7>.

Thus, the fuse data having 128 bits, which are outputted from the eight multiplexers MUX<0:7> included in the first multiplexer group 440A and loaded on the global lines GIO<0:7> in parallel by 8 bits, are outputted through a predetermined data pad DQ<0> in series, and are not outputted through other data pads DQ<1:7>. Thus, the other data pads DQ<1:7> are fixed at a predetermined level HIZ.

Secondarily, referring to FIGS. 8C and 8D, after the enable signal TDID of the die-ID fuse circuit is activated to the logic high level, the precharge pulse DIDPCGB is toggled to the logic low level in response to the toggling of the logic high level of the predetermined command signal CASP10RD. The 16 driving pulses CAS<0:15> are sequentially toggled to the logic high level in response to the toggling of the logic low level of the precharge pulse DIDPCGB.

More specifically, the precharge pulse DIDPCGB is firstly toggled to the logic low level in response to the first toggling RD16 of the logic high level of the predetermined command signal. The first driving pulse CAS<0> of the 16 driving pulses CAS<0:15> is firstly toggled to the logic high level in response to the first toggling of the logic low level of the precharge pulse DIDPCGB. Subsequently, the precharge pulse DIDPCGB is secondarily toggled to the logic low level in response to the second toggling RD17 of the logic high level of the predetermined command signal. The second driving pulse CAS<1> of the 16 driving pulses CAS<0:15> is secondarily toggled to the logic high level in response to the second toggling of the logic low level of the precharge pulse DIDPCGB. Through such a manner, the precharge pulse DIDPCGB is toggled to the logic low level [[a]] at third to sixteenth times in response to the third to sixteenth togglings RD18 to RD31 of the logic high level of the predetermined command signal, respectively. The sixteenth driving pulse CAS<15> of the 16 driving pulses CAS<0:15> is toggled to the logic high level a sixteenth time in response to the sixteenth toggling of the logic low level of the precharge pulse DIDPCGB.

Thus, the evaluation node FUSEND of each of the 16 multiplexers MUX<0:15> is precharged in response to the repeated activation of the precharge pulse DIDPCGB.

Subsequently, the fuse data FZDATA having 256 bits latched on the 256 fuse registers is sequentially loaded on the evaluation node FUSEND of each of the 16 multiplexers MUX<0:15> by 16 bits (SET<0>, SET<16>->SET<1>, SET<17>->SET<2>, SET<18>->SET<3>, SET<19>->SET<4>, SET<20>->SET<5>, SET<21>->SET<6>, SET<22>->SET<7>, SET<23>->SET<8>, SET<24>->SET<9>, SET<25>->SET<10>, SET<26>->SET<11>, SET<27>->SET<12>, SET<28>->SET<13>, SET<29>->SET<14>, SET<30>->SET<15>, SET<31>>).

The address signals BA<0:2> have a value of '4' to '7', the first control signal CBA2 is inactivated to the logic high level, and the second control signal CBA2 is activated to the logic low level. Thus, the fuse data FZDATA having 128 bits, which are sequentially loaded on the evaluation node FUSEND of each of the eight multiplexers MUX<8:15> included in the second multiplexer group 440B by 16 bits (SET<16>->SET<17>->SET<18>->SET<19>->SET<20>->SET<21>->SET<22>->SET<23>->SET<24>->SET<25>->SET<26>->SET<27>->SET<28>->SET<29>->SET<30>->SET<31>), are sequentially transmitted to the eight global lines GIO<0:7>. On the other hand, the fuse data FZDATA having 128 bits, which are sequentially loaded on the evaluation node FUSEND of each of the eight multiplexers MUX<0:7> included in the first multiplexer group 440A by 16 bits (SET<0>->SET<1>->SET<2>->SET<3>->SET<4>->SET<5>->SET<6>->SET<7>->SET<8>->SET<9>->SET<10>->SET<11>->SET<12>->SET<13>->ET<14>->SET<15>), are not transmitted to the global lines GIO<0:7>.

Thus, the fuse data having 128 bits, which are outputted from the eight multiplexers MUX<8:15> included in the second multiplexer group 440B and loaded on the global lines GIO<0:7> in parallel by 8 bits, are outputted through a predetermined data pad DQ<0> in series, and are not outputted through other data pads DQ<1:7>. Thus, the other data pads DQ<1:7> are fixed at a predetermined level HIZ.

As described above, the die-ID fuse circuit in accordance with embodiments of the present invention may minimize an area of the die-ID fuse circuit by grouping and controlling a plurality of fuse registers for latching internal information stored on the plurality of fuses by the predetermined number of groups.

Moreover, the die-ID fuse circuit in accordance with embodiments of the present invention may minimize the die-ID fuse circuit area by configuring output selection multiplexers for sequentially outputting internal information stored on the plurality of fuses using a precharge-evaluation manner.

While the present invention has been described with respect to the specific embodiments, it will be apparent to those skilled in the art that various changes and modifications may be made without departing from the spirit and scope of the invention as defined in the following claims.

For example, the die-ID fuse circuit is exemplified as a fuse circuit in the embodiments of the present invention, however, the present invention may be applied to fuse circuits for storing various information.

What is claimed is:

1. A semiconductor device, comprising:
a fuse array including a plurality of fuses;
a common signal generation unit suitable for receiving a power-up signal, and generating an inverted power-up signal and a reset signal;
a plurality of fuse registers suitable for latching a plurality of fuse data for the plurality of fuses, wherein the plurality of fuse registers are classified into grouped fuse register sets including a predetermined number of fuse registers and the grouped fuse register sets receive commonly the inverted power-up signal and the reset signal from the common signal generation unit, respectively; and
an output selection unit suitable for outputting the plurality of fuse data stored on the plurality of fuse registers according to a predetermined sequence.

2. The semiconductor device of claim 1, wherein after an evaluation node is precharged whenever a predetermined command signal is applied, the output selection unit drives the plurality of fuse data stored on the plurality of fuse registers to the evaluation node according to the predetermined sequence, and determines a logic level value thereof.

3. The semiconductor device of claim 2, wherein the output selection unit comprises:
a precharge unit suitable for precharging the evaluation node whenever a precharge pulse is toggled in response to the predetermined command signal;
a driving unit suitable for driving the plurality of fuse data stored on the plurality of fuse registers to the evaluation node according to the predetermined sequence whenever a driving pulse is toggled in response to an end of toggling of the precharge pulse; and
an evaluation determining unit suitable for determining the logic level value of the evaluation node during a toggling period of the driving pulse.

4. The semiconductor device of claim 1, wherein the reset signal maintains an inactivation state during an activation period of the power-up signal, and maintains an activation state during an inactivation period of the power-up signal.

5. The semiconductor device of claim 4, wherein the plurality of fuse registers latch a predetermined reset value during the activation period of the power-up signal, block a current path having a logic level value opposite to the reset value in response to the reset signal, which maintains the inactivation state during the activation period of the power-up signal, and latch the fuse data of the plurality of fuses during the inactivation period of the power-up signal.

6. The semiconductor device of claim 1, further comprising:
an output driving unit suitable for driving the plurality of fuse data, which are sequentially outputted from the output selection unit according to the predetermined sequence, to a global line, and outputting the plurality of fuse data loaded on the global line to an external device through a predetermined pad.

7. A semiconductor device, comprising:
- a fuse array including a plurality of fuses;
- a common signal generation unit suitable for receiving a power-up signal, and generating an inverted power-up signal and a reset signal;
- first to $N^{th}$ first registers suitable for latching first to $N^{th}$ first fuse data for first to $Nt^h$ fuses out of the plurality of fuses, and commonly receiving the inverted power-up signal and the reset signal from the common signal generation unit;
- first to $N^{th}$ second registers suitable for latching first to $N^{th}$ second fuse data for $N+1^{th}$ to $2N^{th}$ fuses out of the plurality of fuses, and commonly receiving the inverted power-up signal and the reset signal from the common signal generation unit; and
- an output selection unit suitable for outputting the first to $N^{th}$ first fuse data according to a predetermined sequence, and outputting the first to $N^{th}$ second fuse data according to the predetermined sequence.

8. The semiconductor device of claim 7, wherein the first to $N^{th}$ first fuse registers are classified into grouped first fuse register sets including K first fuse registers, each of the grouped first fuse register sets commonly receives the inverted power-up signal and the reset signal, and when N is divided by K, quotient is an integer greater than 2.

9. The semiconductor device of claim 8, wherein the first to $N^{th}$ second fuse registers are classified into grouped second fuse register sets including K second fuse registers, and each of the grouped second fuse register sets commonly receives the inverted power-up signal and the reset signal.

10. The semiconductor device of claim 7, wherein when predetermined command signals are repeatedly received,
- the output selection unit precharges the evaluation node and drives each of the N first fuse data to the evaluation node according to the predetermined sequence to determine a logic level value of the evaluation node whenever first to $N^{th}$ predetermined command signals are received, and
- the output selection unit precharges the evaluation node and drives each of the N second fuse data to the evaluation node according to the predetermined sequence to determine a logic level value of the evaluation node whenever $N+1^{th}$ to $2N^{th}$ predetermined command signals are received.

11. The semiconductor device of claim 7, wherein the output selection unit comprises:
- a precharge unit suitable for precharging the evaluation node whenever the precharge pulse is toggled in response to the predetermined command signal;
- a driving unit suitable for driving the first to $N^{th}$ first fuse data to the evaluation node according to the predetermined sequence in response to an end of toggling of the precharge pulse and driving the first to $N^{th}$ second fuse data to the evaluation node according to the predetermined sequence whenever the driving pulse is toggled; and
- an evaluation determining unit suitable for determining the logic level value of the evaluation node during a toggling period of the driving pulse.

12. The semiconductor device of claim 7, wherein the reset signal maintains an inactivation state during an activation period of the power-up signal, and an activation state during an inactivation period of the power-up signal.

13. The semiconductor device of claim 12, wherein the first to $N^{th}$ first fuse registers latch a predetermined reset value during the activation period of the power-up signal, block a current path having an inverted logic level value of the reset value in response to the reset signal, which maintains the inactivation state during the activation period of the power-up signal, and latch the first to $Nt^h$ first fuse data during the inactivation period of the power-up signal.

14. The semiconductor device of claim 13, wherein the first to $N^{th}$ second fuse registers latch a predetermined reset value during the activation period of the power-up signal, block a current path having the inverted logic level value of the reset value in response to the reset signal, which maintains the inactivation state during the activation period of the power-up signal, and latch the first to $N^{th}$ second fuse data during the inactivation period of the power-up signal.

15. The semiconductor device of claim 13, further comprising:
- an output driving unit suitable for driving the first to $N^{th}$ first fuse data, which are outputted from the output selection unit according to the predetermined sequence, to global lines, driving the first to $N^{th}$ second fuse data to the global lines, and outputting the first to $N^{th}$ first fuse data and the first to $N^{th}$ second fuse data to an external device through a predetermined pad.

* * * * *